(12) United States Patent
Bando (10) Patent No.: US 7,209,362 B2
(45) Date of Patent: Apr. 24, 2007

(54) MULTILAYER CERAMIC SUBSTRATE WITH A CAVITY

(75) Inventor: Tomoya Bando, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 58 days.

(21) Appl. No.: 10/614,708

(22) Filed: Jul. 7, 2003

(65) Prior Publication Data

US 2004/0017670 A1 Jan. 29, 2004

(30) Foreign Application Priority Data

Jul. 26, 2002 (JP) ............................. 2002-218349

(51) Int. Cl.
*H05K 1/18* (2006.01)
(52) U.S. Cl. .................... 361/761; 361/765; 361/301.1
(58) Field of Classification Search ........ 361/760–765, 361/301.1, 306.1, 306.3, 783, 792–795; 174/259–262; 257/685–686, 301
See application file for complete search history.

(56) References Cited

U.S. PATENT DOCUMENTS

| 5,831,810 | A | * | 11/1998 | Bird et al. ............... 361/301.1 |
| 6,163,456 | A | * | 12/2000 | Suzuki et al. .............. 361/704 |
| 6,489,670 | B1 | * | 12/2002 | Peterson et al. ............. 257/686 |

FOREIGN PATENT DOCUMENTS

| JP | 06-085108 A | 3/1994 |
| JP | 10-022415 | 1/1998 |
| JP | 10-190227 A | 7/1998 |
| JP | 10-335823 | 12/1998 |
| JP | 11-135560 A | 5/1999 |
| JP | 11-186448 | 7/1999 |
| JP | 2000-332156 | 11/2000 |
| JP | 2001-015878 | 1/2001 |
| JP | 2001-028413 | 1/2001 |
| JP | 2001-196501 A | 7/2001 |

OTHER PUBLICATIONS

Official Communication cited in corresponding Japanese Patent Application No. 2002-218349, dated May 23, 2006.
Official Communication issued in corresponding Japanese Patent Application No. 2002-218349, dated Aug. 29, 2006.

* cited by examiner

*Primary Examiner*—Tuan Dinh
(74) *Attorney, Agent, or Firm*—Keating & Bennett, LLP (57) ABSTRACT

A multilayer ceramic substrate with a cavity includes a multilayer composite member including a plurality of ceramic layers disposed one on another. A cavity is formed in the multilayer composite member such that an opening of the cavity is located in one principal surface of the multilayer composite member. A bottom-surface conductive film is disposed on the bottom surface of the cavity. A capacitor conductive film is disposed in the multilayer composite member such that the capacitor conductive film faces the bottom-surface conductive film via one of the ceramic layers, thereby forming a capacitor.

38 Claims, 8 Drawing Sheets

MULTILAYER CERAMIC SUBSTRATE WITH A CAVITY

BACKGROUND OF THE INVENTION

1. Field of the Invention

The present invention relates to a multilayer ceramic substrate having a cavity, and more particularly, to an improved multilayer ceramic substrate with a cavity having a reduced thickness.

2. Description of the Related Art

Figure 8:
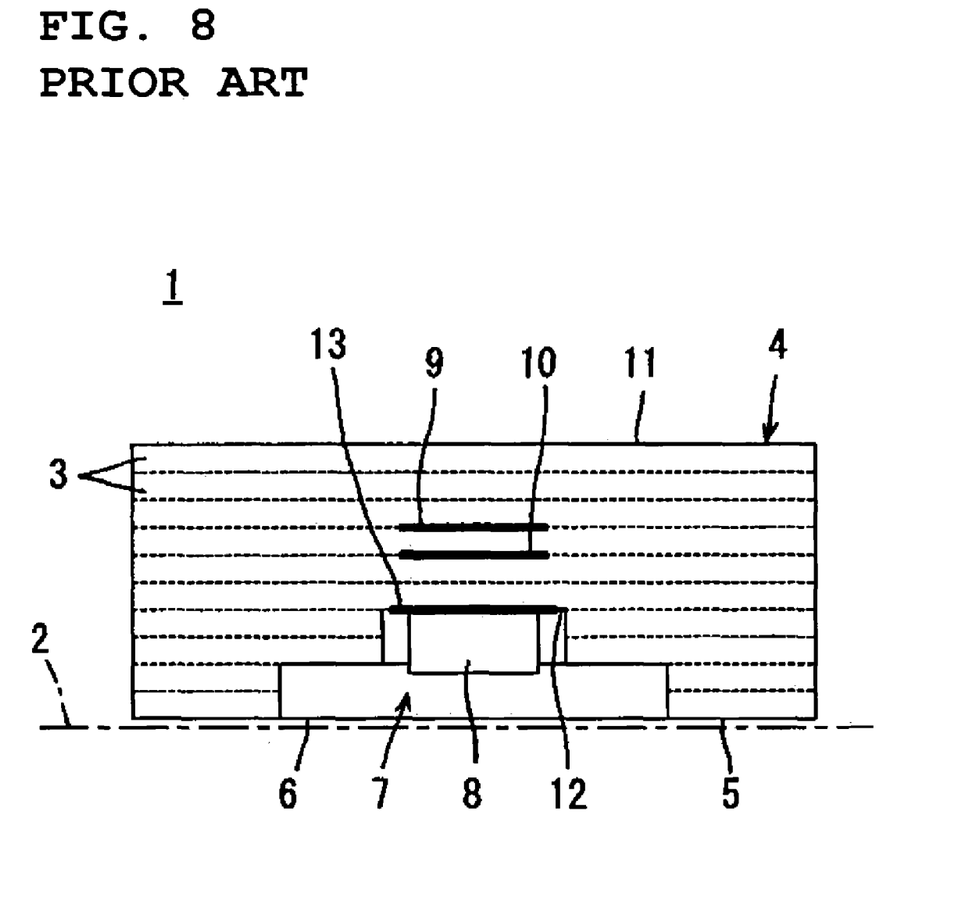
FIG. 8 is a cross-sectional view showing a conventional multilayer ceramic substrate with a cavity.

FIG. 8 is a cross-sectional view showing a multilayer ceramic substrate 1 with a cavity that is manufactured by conventional techniques.

The multilayer ceramic substrate 1 with the cavity is designed such that it may be mounted on a mounting mother board 2 represented by the hatched line. The multilayer ceramic substrate 1 with the cavity includes a multilayer composite member 4 having a plurality of ceramic layers 3 disposed one on another. A cavity 7 is formed in the multilayer composite member 4 such that the cavity 7 has an opening 6 located in at least one principal surface of the multilayer composite member 4 (for example, in a principal surface 5 facing the mounting mother board 2). An electronic component 8 in the form of a chip, such as an integrated circuit or a surface acoustic wave filter, is disposed in the cavity 7.

Although not clearly shown in FIG. 8, a plurality of inner conductive films and a plurality of via-holes are formed in the multilayer composite member 4 so as to provide interconnection lines needed in the multilayer ceramic substrate 1. As required, some of those inner conductive films and/or via-hole conductors are arranged so as to provide a capacitor, an inductor, a delay line, and/or a filter. In some cases, in addition to the inner conductive films described above, a resistive film is disposed in the multilayer composite member 4 so as to provide a resistor.

In the multilayer composite member 4 shown in FIG. 8, a pair of capacitor conductive films 9 and 10 is arranged such that they face each other through one of the ceramic layer 3, thereby defining a capacitor.

In some cases, although not shown in FIG. 8, external conductive films are formed on the other principal surface 11 of the multilayer composite member 4 opposite to the principal surface 5 in which the cavity 7 is formed, and another electronic component such as a capacitor, an inductor, a resistor, a diode, an integrated circuit, or a memory is mounted using the external conductive films.

In many cases, a bottom-surface conductive film 13 is formed on the bottom surface 12 of the cavity 7. The chief ingredient of the bottom-surface conductive film 13 is a metal. This allows the bottom-surface conductive film 13 to have a color different from that of the ceramic layers 3 or the electronic component 8. The difference in color makes it easy to optically detect the location of the electronic component 8 when the electronic component 8 is put into the cavity 7. That is, one of functions of the bottom-surface conductive film 13 is to make it easy to detect the location of the electronic component 8.

In general, a ground potential is applied to the bottom-surface conductive film 13. In this case, when an electronic component 8 is needed to be grounded, the bottom-surface conductive film 13 is electrically connected to the electronic component 8 to supply the ground potential to the electronic component 8.

Regardless of whether the ground potential is applied to the bottom-surface conductive film 13, if the electronic component 8 is not needed to be electrically connected to the bottom-surface conductive film 13, the electronic component 8 may be connected to the bottom-surface conductive film 13 via a nonconductive adhesive.

There has been a desire to further reduce the size of electronic devices. In order to satisfy the desire, it is required to reduce the size of various electronic components used in electronic devices. Thus, it is also desirable to reduce the size of the multilayer ceramic substrate 1 with the cavity. In particular, a reduction in the total thickness of the multilayer ceramic substrate 1 with the cavity is very desirable.

The reduction in the total thickness of the multilayer ceramic substrate with the cavity 1 shown in FIG. 8 can be achieved by applying preferred embodiments of the present invention.

SUMMARY OF THE INVENTION

In order to overcome the problems described above, preferred embodiments of the present invention provide a multilayer ceramic substrate with a cavity constructed so as to have a very small total thickness.

According to a first preferred embodiment of the present invention, a multilayer ceramic substrate with a cavity includes a multilayer composite member including a plurality of ceramic layers disposed on one another, the cavity disposed in the multilayer composite member such that an opening of the cavity is located in at least one principal surface of the multilayer composite member, a bottom-surface conductive film disposed on a bottom surface of the cavity, an electronic component disposed in the cavity, and a capacitor conductive film disposed in the multilayer composite member such that the capacitor conductive film faces the bottom-surface conductive film via one of the ceramic layers, thereby defining a capacitor.

In preferred embodiments of the present invention, the bottom-surface conductive film is also used for forming a capacitor, thereby allowing conductive films disposed in association with the multilayer composite member to be used in a more efficient manner in which the structure can be constructed using a reduced number of conductive films and a reduced number of ceramic layers, and thus allowing the multilayer ceramic substrate with the cavity to be constructed to have a smaller total thickness.

The bottom-surface conductive film is generally formed over a large area on the bottom surface of a cavity, and thus the bottom-surface conductive film can be advantageously used to define a capacitor. The use of the bottom-surface conductive film in a capacitor can be realized using recent advanced techniques of producing multilayer ceramic substrates having a cavity.

Conventionally, a multilayer ceramic substrate with a cavity is produced as follows. First, a raw multilayer composite member having a cavity is produced by stacking a plurality of ceramic green sheets on one another. The raw multilayer composite member is then pressed in a thickness direction. Thereafter, the raw multilayer composite member is baked. In the above-described production process, it is difficult to uniformly press the multilayer composite member. In particular, a pressure is not uniformly applied to the bottom surface of the cavity. When the multilayer composite member contracts during the baking process, the presence of the cavity causes the multilayer composite member to contract non-uniformly. For the above-described reasons, it is difficult to obtain a flat surface at the bottom of the cavity. Even if a capacitor is formed using a bottom-surface conductive film formed on the bottom surface of the cavity, the non-flat bottom surface results in great variations in the capacitance, and thus, such a capacitor cannot be used in practice.

However, as a result of recent advances in production processes, it has become possible to obtain a flat surface at the bottom of the cavity. An example of the advanced techniques is the use of an elastic material which can deform along the inner walls of a cavity during the pressing process. Another example is the use of a constraining layer containing inorganic material powder for suppressing contraction. If a raw multilayer composite member constrained by such a constraining layer is baked, it is possible to bake it without contraction occurring. The conductive film formed on the bottom surface of the cavity by these advanced techniques can be sufficiently flat so as to produce a capacitor which can be used in practice. This makes it possible to realize the above-described preferred embodiments of the present invention.

In the multilayer ceramic substrate with a cavity according to the preferred embodiments of the present invention, the bottom-surface conductive film is preferably grounded.

The electronic component disposed in the cavity may be connected to the bottom-surface conductive film via a non-conductive adhesive or may be electrically connected to the bottom-surface conductive film.

The bottom-surface conductive film may be disposed so as to extend into the inside of the multilayer composite member across an edge of the bottom surface of the cavity or may be disposed so as extend on the bottom surface of the cavity within the inside of the cavity.

Preferably, the capacitor conductive film is arranged so as to face the bottom-surface conductive film via one ceramic layer.

The capacitor conductive film may be constructed in the shape of a strip-line such that distributed constant capacitance is formed between the capacitor conductive film and the bottom-surface conductive film.

When the multilayer ceramic substrate with the cavity according to preferred embodiments of the present invention is used by mounting it on a mounting mother board, an external terminal electrode, which is to be electrically connected to the mounting mother board when the multilayer ceramic substrate is mounted on the mounting mother board, is disposed on the outer surface of the multilayer composite member. The bottom-surface conductive film may be electrically connected to the external terminal electrode.

In the multilayer ceramic substrate with the cavity according to preferred embodiments of the present invention, a capacitor conductive film is disposed in the multilayer composite member such that the capacitor conductive film faces the bottom-surface conductive film via one of the ceramic layers, thereby defining capacitor. This allows the bottom-surface conductive film to be used in an efficient manner to form a capacitor. That is, compared with the conventional structure in which a pair of conductive films is disposed for dedicated use for defining a capacitor, the multilayer ceramic substrate with the cavity can be realized using fewer ceramic layers, and thus, a reduction in the total thickness of the multilayer ceramic substrate with the cavity can be achieved.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
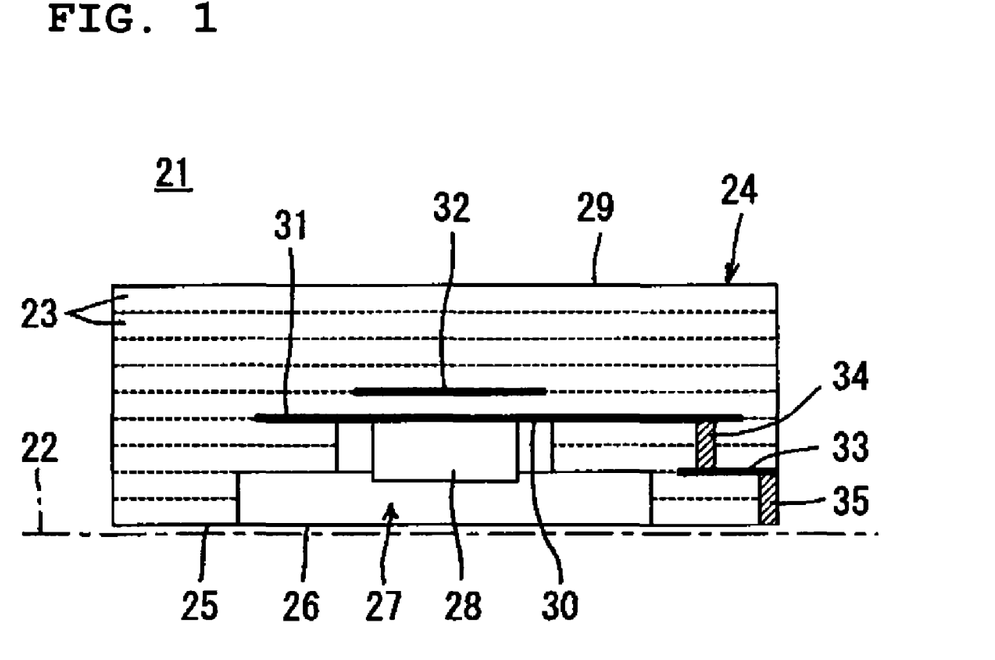
FIG. 1 is a cross-sectional view showing a multilayer ceramic substrate with a cavity according to a first preferred embodiment of the present invention.

FIG. 1 is a cross-sectional view showing a multilayer ceramic substrate with a cavity 21 according to the first preferred embodiment of the present invention.

The multilayer ceramic substrate 21 with the cavity is designed such that it may be mounted on a mounting mother board 22 represented by the hatched line. The multilayer ceramic substrate 21 with the cavity includes a multilayer composite member 24 including a plurality of ceramic layers 23 disposed one on another. A cavity 27 is formed in the multilayer composite member 24 such that the cavity 27 has an opening 26 located in at least one principal surface of the multilayer ceramic substrate (for example, in a principal surface 25 facing the mounting mother board 22). An electronic component 28 preferably in the form of a chip, such as an integrated circuit or a surface acoustic wave filter, is disposed in the cavity 27.

Although not shown in FIG. 1, one or more external conductive films may be provided on the other principal surface 29 of the multilayer composite member 24 opposite to the principal surface 25 in which the cavity 27 is formed, and other electronic components such as a capacitor, an inductor, a resistor, a diode, an integrated circuit, and/or a memory may be mounted using the external conductive films.

A bottom-surface conductive film 31 is formed on the bottom surface 30 of the cavity 27. In the first preferred embodiment, the bottom-surface conductive film 31 extends into the inside of the multilayer composite member 24 across an edge of the bottom surface 30 of the cavity 27.

The multilayer composite member 24 has a plurality of inner conductive films disposed along interfaces between ceramic layers 23, and a plurality of via-holes are formed through some of the ceramic layers 23.

One of those inner conductive films is used as a capacitor conductive film 32 as shown in FIG. 1. The capacitor conductive film 32 is arranged such that it faces the bottom-surface conductive film 31 via one ceramic layer 23, thereby defining a capacitor. If the capacitor conductive film 32 is arranged such that it faces the bottom-surface conductive film 31 via only one ceramic layer 23, a relatively large capacitance can be achieved. Another inner conductive film 33 of the inner conductive films is also shown in FIG. 1.

A via-hole conductor 34 is also shown in FIG. 1. This via-hole conductor 34 is used to electrically connect the bottom-surface conductive film 31 and the inner conductive film 33 with each other.

Furthermore, a plurality of external terminal electrodes are arranged on the outer surface of the multilayer composite member 24 such that when the multilayer ceramic substrate 21 with the cavity is mounted on the mounting mother board 22, those external terminal electrodes are electrically connected to the mounting mother board 22. One of the external terminal electrodes 35 is shown in FIG. 1. This external terminal electrode 35 is electrically connected to the inner conductive film 33 and to the bottom-surface conductive film 31 via the via-hole conductor 34.

In the present preferred embodiment of the present invention, the external terminal electrodes 35 are preferably formed in a similar manner to the via-hole conductors. More specifically, after normal via-hole conductors are formed, if the via-hole conductors are divided using a roller or the like, external terminal electrodes are formed.

If the external terminal electrode 35 is electrically connected to a ground electrode on the mounting mother board 22, the bottom-surface conductive film 31 is grounded. When the electronic component 28 needs to be grounded, the electronic component 28 is electrically connected to the bottom-surface conductive film 31, thereby grounding the electronic component 28.

The external terminal electrode 35 may not be electrically connected to the ground electrode on the mounting mother board 22. In this arrangement, the electronic component 28 may be grounded by electrically connecting it to a ground conductor in the multilayer composite member 24 by wire bonding or other suitable connection member.

The electronic component 28 may not be electrically connected to the bottom-surface conductive film 31. In this arrangement, the electronic component 28 may be connected to the bottom-surface conductive film 31 via a nonconductive adhesive (not shown).

Of inner conductive films and via-hole conductors disposed in the multilayer composite members 24, only typical ones are shown in FIG. 1. The inner conductive films and the via-hole conductors provide interconnection lines necessary in the multilayer ceramic substrate 21 with the cavity. As required, inner conductive films and via-hole conductors may also be used to form other elements such as a capacitor other than the capacitor defined by the bottom-surface conductive film 31 and the capacitor conductive film 32, an inductor, delay line, and/or a filter. Furthermore, as required, a resistor film may also be disposed in the multilayer composite member 24.

The multilayer ceramic substrate 21 with the cavity may also include a device such as an RF switch needed in an RF module used in a radio communication device such as a portable telephone. The device needed in the RF module may be disposed inside the multilayer composite member 24 or on the multilayer composite member 24.

It may be necessary to adjust the capacitance of the capacitor defined between the capacitor conductive film 32 and the bottom-surface conductive film 31. Because at least a portion of the bottom-surface conductive film 31 is exposed in the cavity 27, the capacitance can be easily adjusted by trimming.

When the bottom-surface conductive film 31 is disposed to extend into the inside of the multilayer composite member 24 across an edge of the bottom surface 30 of the cavity 27 as shown in FIG. 1, the trimming can be performed by removing a region of the bottom-surface conductive film 31 exposed on the bottom surface 30 of the cavity 27. A region may be entirely removed, or only a peripheral potion of a region may be removed.

In the preferred embodiments described later with reference FIGS. 2, 4, or 7 where an edge of the bottom-surface conductive film 31, 31a, or 31b is located on the bottom surface 30 of the cavity 27, the trimming may be performed in a similar manner to the previous example or may be performed by cutting an end portion of the bottom-surface conductive film 31, 31a, or 31b.

Second to seventh preferred embodiments are described below with reference to FIGS. 2 to 7. In FIGS. 2 through 7, as in FIG. 1, only typical parts are shown. In FIGS. 2 through 7, similar parts to those in FIG. 1 are denoted by the same reference numerals, and duplicated descriptions of them are not given herein.

Figure 2:
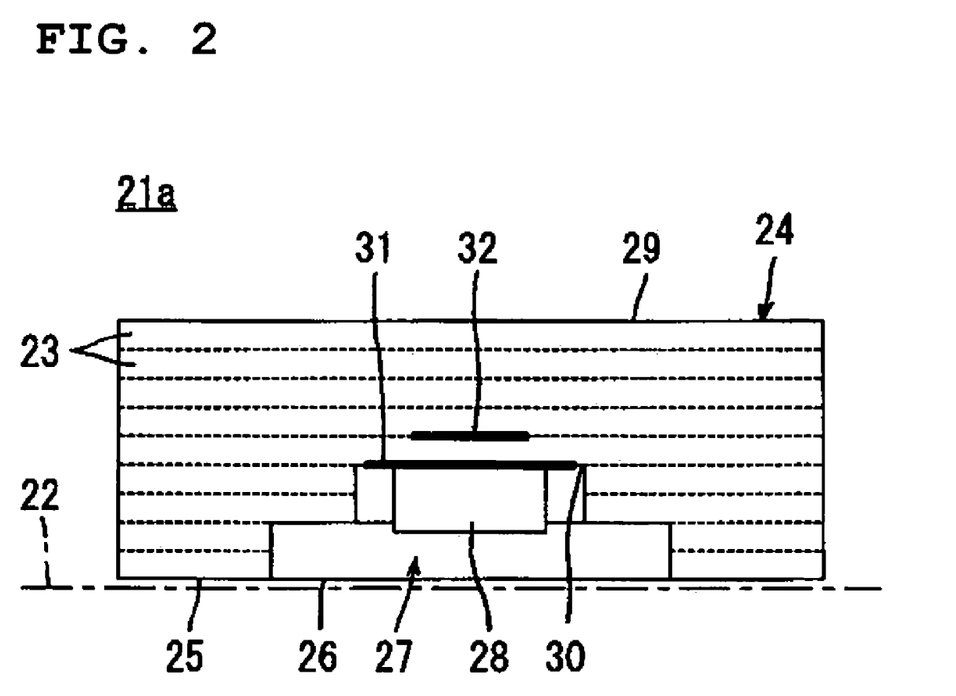
FIG. 2 is a cross-sectional view showing a multilayer ceramic substrate with a cavity according to a second preferred embodiment of the present invention.

In a multilayer ceramic substrate 21a with a cavity shown in FIG. 2, a bottom-surface conductive film 31 is arranged to extend on a bottom surface 30 of the cavity 27.

Although electrical connections of the bottom-surface conductive film 31 are not shown in FIG. 2, the bottom-surface conductive film 31 may be electrically connected via a via-hole conductor to an inner conductive film other than the capacitor conductive film 32 or may be electrically connected to a stripe-shaped conductive film disposed on the same surface as that on which the bottom-surface conductive film 31 is disposed. The bottom-surface conductive film 31 may also be electrically connected to an electronic component 28, thereby electrically connecting the electronic component 28 to a capacitor defined by the bottom-surface conductive film 31 and the capacitor conductive film 32.

Figure 3:
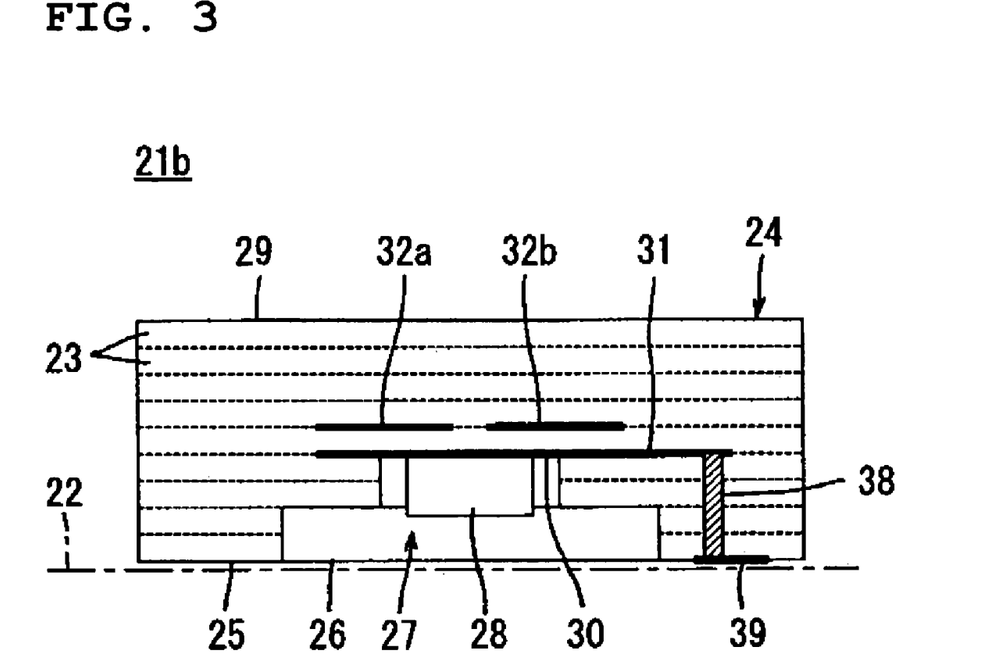
FIG. 3 is a cross-sectional view showing a multilayer ceramic substrate with a cavity according to a third preferred embodiment of the present invention.

In a multilayer ceramic substrate 21b with a cavity shown in FIG. 3, a bottom-surface conductive film 31 is arranged to extend into the inside of a multilayer composite member 24 across an edge of a bottom surface 30 of a cavity 27, and two capacitor conductive films 32a and 32b are arranged such that they are located in the same plane and such that they face the bottom-surface conductive film 31.

The bottom-surface conductive film 31 is electrically connected to an external terminal electrode 39 via a via-hole conductor 38. The external terminal electrode 39 is of a land grid array type and may be formed by applying a conductive paste using a printing process or a transfer process and then baking the conductive paste.

Figure 4:
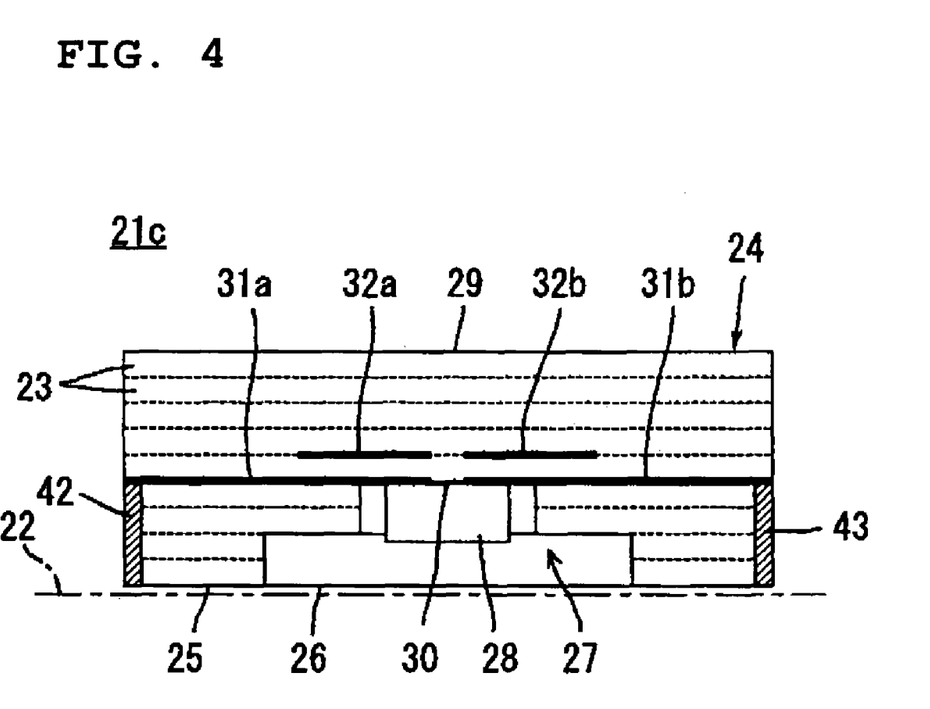
FIG. 4 is a cross-sectional view showing a multilayer ceramic substrate with a cavity according to a fourth preferred embodiment of the present invention.

In a multilayer ceramic substrate 21c with a cavity shown in FIG. 4, two bottom-surface conductive films 31a and 31b are disposed side by side on a bottom surface 30 of a cavity 27. The bottom-surface conductive films 31a and 31b both extend into the inside of the multilayer composite member 24 across the edges of a bottom surface 30 of a cavity 27 to reach corresponding side surfaces of the multilayer composite member 24.

External electrode terminals 42 and 43 are disposed on the side surfaces of the multilayer composite member 24, and the two bottom-surface conductive films 31a and 31b are electrically connected to the external terminal electrodes 42 and 43, respectively. The external terminal electrodes 42 and 43 may be formed by methods similar to the method used to form external terminal electrode 35 shown in FIG. 1.

In the inside of the multilayer composite member 24, two capacitor conductive films 32a and 32b are arranged side by side such that they face the bottom-surface conductive films 31a and 31b, respectively, via one ceramic layer.

Figure 5:
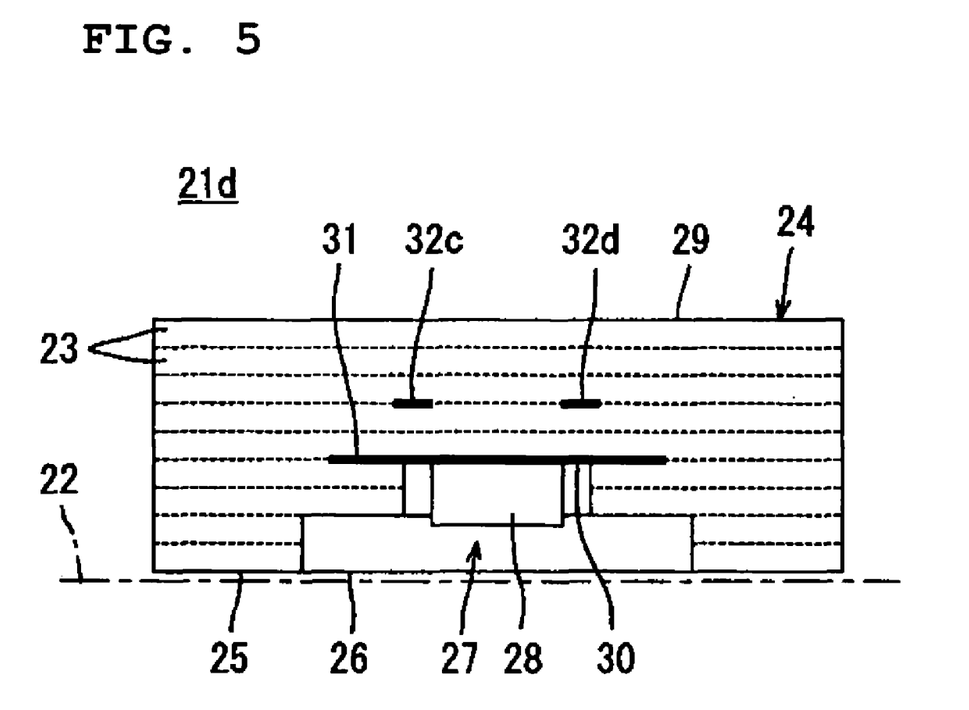
FIG. 5 is a cross-sectional view showing a multilayer ceramic substrate with a cavity according to a fifth preferred embodiment of the present invention.

In a multilayer ceramic substrate 21d with a cavity shown in FIG. 5, capacitor conductive films 32c and 32d are formed as strip-lines facing a bottom-surface conductive film 31 such that distributed constant capacitance is formed between the bottom-surface conductive film 31 and the capacitor conductive films 32c and 32d. In this preferred embodiment of the present invention, although not shown in FIG. 5, the bottom-surface conductive film 31 is grounded, and, in order to obtain a necessary triplate thickness, a plurality of ceramic layers 23 are disposed between the grounded bottom-surface conductive film 31 and the capacitor conductive films 32c and 32d.

Figure 6:
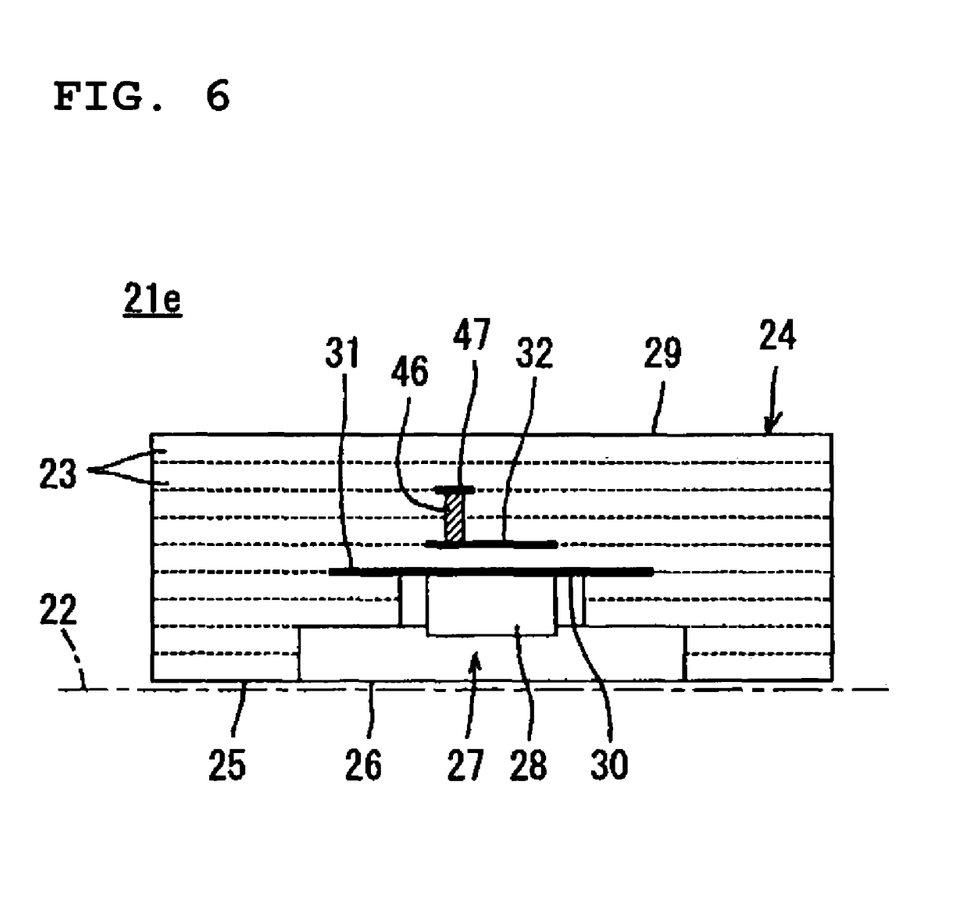
FIG. 6 is a cross-sectional view showing a multilayer ceramic substrate with a cavity according to a sixth preferred embodiment of the present invention.

In a multilayer ceramic substrate 21e with a cavity shown in FIG. 6, a stripe-shaped inner conductive film 47 is electrically connected to a capacitor conductive film 32 through a via-hole conductor 46. The inner conductive film 47 is a portion of an inner conductive film which defines, for example, an inductor. Although not shown in FIG. 6, the bottom-surface conductive film 31 is grounded. In this structure, a resonant circuit including a series connection of an inductor and a capacitor is defined using the bottom-surface conductive film 31, the capacitor conductive film 32, the via-hole conductor 46 and the inner conductive film 47.

Figure 7:
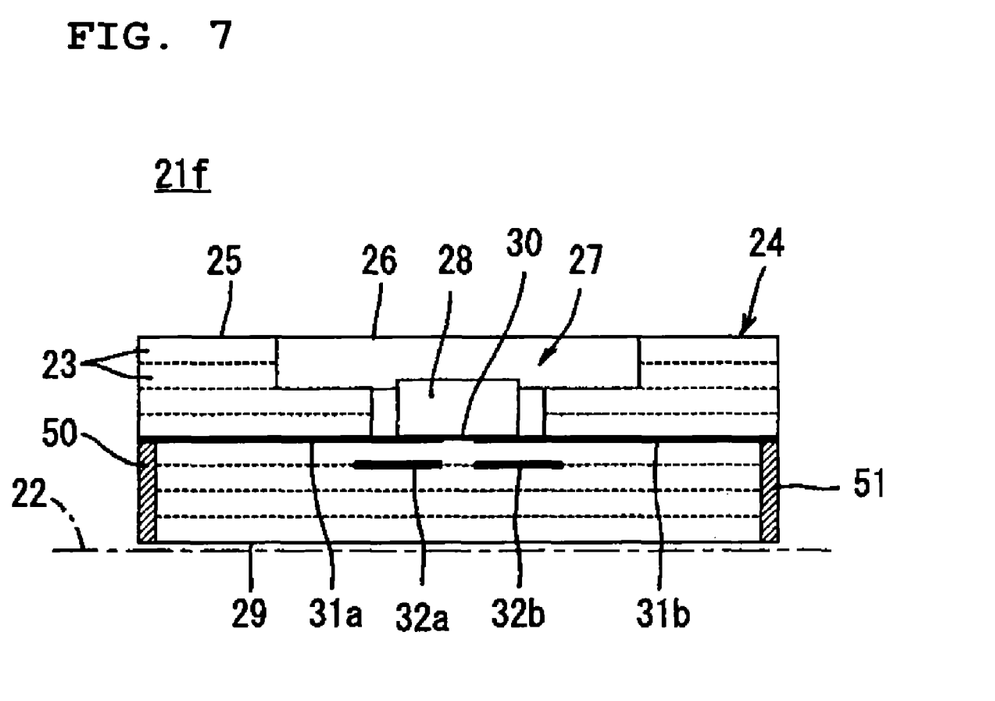
FIG. 7 is a cross-sectional view showing a multilayer ceramic substrate with a cavity according to a seventh preferred embodiment of the present invention.

A multilayer ceramic substrate 21f with a cavity shown in FIG. 7, unlike the multilayer ceramic substrates 21a to 21e with cavity described above, is designed such that when it is mounted on a mounting mother board 22, a principal surface 29, opposite to a principal surface 25 on the side of which the cavity 27 is formed, comes into contact with the mounting mother board 22.

In this multilayer ceramic substrate 21f with the cavity shown in FIG. 7, two bottom-surface conductive films 31a and 31b and two capacitor conductive films 32a and 32b are formed in a similar manner as in the multilayer ceramic substrate with the cavity 21c shown in FIG. 4. The bottom-surface conductive films 31a and 31b are electrically connected to external terminal electrodes 50 and 51, respectively.

The bottom-surface conductive films 31a and 31b, the capacitor conductive films 32a and 32b, and the external terminal electrodes 50 and 51 are not necessarily formed in the above-described manner. That is, the purpose of the present preferred embodiments is only to show that the present invention can also be applied to a multilayer ceramic substrate, such as that shown in FIG. 7, having a cavity 27 which is designed to be located on the upper portion when it is mounted on a mounting mother board 22.

The present invention has been described above with reference to some preferred embodiments in conjunction with the drawings. The present invention is not limited to those preferred embodiments, but many modifications are possible without departing from the scope of the invention.

For example, the number of ceramic layers 23 of the multilayer composite member 24, the locations, the shape, the size, and the number of cavities 27, and the locations of the inner conductive films, the via-hole conductors, the external terminal electrode and other parts associated with the multilayer composite member 24 may be arbitrarily changed as required in the design of the multilayer ceramic substrate with the cavity.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayer ceramic substrate with a cavity comprising:
    a multilayer composite member including a plurality of ceramic layers disposed one on another;
    a cavity formed in the multilayer composite member such that an opening of the cavity is located in at least one principal surface of the multilayer composite member;
    a bottom-surface conductive film connected to a ground potential, the bottom-surface conductive film being disposed on a bottom surface of the cavity;
    a plurality of conductive films disposed in the multilayer composite member; and
    an electronic component electrically connected to the bottom-surface conductive film, the electronic component being disposed in the cavity;
    among the plurality of conductive films, the conductive film which is disposed closest to the bottom-surface conductive film is arranged in the multilayer composite member so as to define a capacitor conductive film which faces the bottom-surface conductive film via at least one of the plurality of ceramic layers to produce a capacitance, the capacitor conductive film being arranged such that a space between the bottom-surface conductive film and the capacitor conductive film is smaller than a space between all of the other conductive films of the plurality of conductive films and the capacitor conductive film; and
    an area of the capacitor conductive film is smaller than an area of the bottom-surface conductive film, and the capacitor conductive film is symmetrically arranged with respect to a center of the electronic component disposed in the cavity, where the center is defined in a bottom surface direction of the cavity.

2. The multilayer ceramic substrate with a cavity according to claim 1, wherein the electronic component is adhered on the bottom-surface conductive film via a non-conductive adhesive.

3. The multilayer ceramic substrate with a cavity according to claim 1, wherein the electronic component is electrically connected to the bottom-surface conductive film.

4. The multilayer ceramic substrate with a cavity according to claim 1, wherein the bottom-surface conductive film is disposed so as to extend into the inside of the multilayer composite member across an edge of the bottom surface of the cavity.

5. The multilayer ceramic substrate with a cavity according to claim 1, wherein the bottom-surface conductive film is disposed so as to extend on the bottom surface of the cavity and within the inside of the cavity.

6. The multilayer ceramic substrate with a cavity according to claim 1, wherein the capacitor conductive film is disposed so as to face the bottom-surface conductive film via a single ceramic layer.

7. The multilayer ceramic substrate with a cavity according to claim 1, wherein the capacitor conductive film is constructed in the shape of a strip-line such that distributed constant capacitance is defined between the capacitor conductive film and the bottom-surface conductive film.

8. The multilayer ceramic substrate with a cavity according to claim 1, wherein an external terminal electrode, which is to be electrically connected to a mounting mother board when the multilayer ceramic substrate is mounted on the mounting mother board, is formed on an outer surface of the multilayer composite member, and the bottom-surface conductive film is electrically connected to the external terminal electrode.

9. The multilayer ceramic substrate with a cavity according to claim 1, wherein when the multilayer ceramic substrate is mounted on a mounting mother board, the principal surface of the multilayer composite member with the cavity comes into contact with the mounting mother board.

10. The multilayer ceramic substrate with a cavity according to claim 1, wherein when the multilayer ceramic substrate is mounted on a mounting mother board, the principal surface of the multilayer composite member opposite the principal surface with the cavity comes into contact with the mounting mother board.

11. The multilayer ceramic substrate with a cavity according to claim 1, further comprising a second bottom-surface conductive film disposed on a bottom surface of the cavity.

12. The multilayer ceramic substrate with a cavity according to claim 1, further comprising a second capacitor conductive film disposed in the multilayer composite member such that the capacitor conductive film faces the bottom-surface conductive film via at least one ceramic layer.

13. The multilayer ceramic substrate with a cavity according to claim 1, further comprising:
 a second bottom-surface conductive film disposed on a bottom surface of the cavity; and
 a second capacitor conductive film disposed in the multilayer composite member such that the capacitor conductive film faces the bottom-surface conductive film via at least one ceramic layer.

14. The multilayer ceramic substrate with a cavity according to claim 1, wherein the capacitance between the capacitor conductive film and the bottom-surface conductive film is adjusted by removing an area of the bottom-surface conductive film.

15. The multilayer ceramic substrate with a cavity according to claim 1, further comprising an inductor conductive film disposed in the multilayer composite member such that the capacitor conductive film faces the capacitor conductive film via at least one ceramic layer.

16. The multilayer ceramic substrate with a cavity according to claim 12, wherein at least one of the capacitor conductive film and the second capacitor conductive film is strip-line shaped.

17. The multilayer ceramic substrate with a cavity according to claim 13, wherein at least one of the capacitor conductive film and the second capacitor conductive film is strip-line shaped.

18. The multilayer ceramic substrate with a cavity according to claim 14, wherein the area of the bottom-surface conductive film is removed by one of trimming and cutting.

19. The multilayer ceramic substrate with a cavity according to claim 15, wherein the inductor conductive film, the capacitor conductive film, and the bottom-surface conductive film define a series resonant circuit.

20. A multilayer ceramic substrate comprising:
 a multilayer composite member including a plurality of ceramic layers disposed one on another;
 a cavity formed in the multilayer composite member such that an opening of the cavity is located in at least one principal surface of the multilayer composite member;
 a bottom-surface conductive film connected to a ground potential, the bottom-surface conductive film being disposed on a bottom surface of the cavity;
 a plurality of conductive films disposed in the multilayer composite member;
 an electronic component electrically connected to the bottom-surface conductive film, the electronic component being disposed in the cavity; and
 an element disposed in the multilayer composite member; wherein
 among the plurality of conductive films, the conductive film which is disposed closest to the bottom-surface conductive film is arranged in the multilayer composite member so as to define a capacitor conductive film which faces the bottom-surface conductive film via at least one of the plurality of ceramic layers to produce a capacitance, the capacitor conductive film being arranged such that a space between the bottom-surface conductive film and the capacitor conductive film is smaller than a space between all of the other conductive films of the plurality of conductive films and the capacitor conductive film;
 an area of the capacitor conductive film is smaller than an area of the bottom-surface conductive film, and the capacitor conductive film is symmetrically arranged with respect to a center of the electronic component disposed in the cavity, where the center is defined in a bottom surface direction of the cavity; and
 the element is electrically connected to one of the capacitor conductive film and the bottom-surface conductive film.

21. The multilayer ceramic substrate according to claim 20, wherein the electronic component is adhered on the bottom-surface conductive film via a non-conductive adhesive.

22. The multilayer ceramic substrate according to claim 20, wherein the electronic component is electrically connected to the bottom-surface conductive film.

23. The multilayer ceramic substrate according to claim 20, wherein the bottom-surface conductive film is disposed so as to extend into the inside of the multilayer composite member across an edge of the bottom surface of the cavity.

24. The multilayer ceramic substrate according to claim 20, wherein the bottom-surface conductive film is disposed so as to extend on the bottom surface of the cavity and within the inside of the cavity.

25. The multilayer ceramic substrate according to claim 20, wherein the capacitor conductive film is disposed so as to face the bottom-surface conductive film via a single ceramic layer.

26. The multilayer ceramic substrate according to claim 20, wherein the capacitor conductive film has a strip-line shape such that distributed constant capacitance is defined between the capacitor conductive film and the bottom-surface conductive film.

27. The multilayer ceramic substrate according to claim 20, wherein an external terminal electrode, which is to be electrically connected to a mounting mother board when the multilayer ceramic substrate is mounted on the mounting mother board, is located on an outer surface of the multilayer composite member, and the bottom-surface conductive film is electrically connected to the external terminal electrode.

28. The multilayer ceramic substrate according to claim 20, wherein when the multilayer ceramic substrate is mounted on a mounting mother board, the principal surface of the multilayer composite member having the cavity comes into contact with the mounting mother board.

29. The multilayer ceramic substrate according to claim 20, wherein when the multilayer ceramic substrate is mounted on a mounting mother board, the principal surface of the multilayer composite member opposite the principal surface with the cavity comes into contact with the mounting mother board.

30. The multilayer ceramic substrate according to claim 20, further comprising a second bottom-surface conductive film disposed on a bottom surface of the cavity.

31. The multilayer ceramic substrate according to claim 20, further comprising a second capacitor conductive film disposed in the multilayer composite member such that the capacitor conductive film faces the bottom-surface conductive film via at least one ceramic layer.

32. The multilayer ceramic substrate according to claim 20, further comprising:
   a second bottom-surface conductive film disposed on a bottom surface of the cavity; and
   a second capacitor conductive film disposed in the multilayer composite member such that the capacitor conductive film faces the bottom-surface conductive film via at least one ceramic layer.

33. The multilayer ceramic substrate according to claim 20, wherein the capacitance between the capacitor conductive film and the bottom-surface conductive film is adjusted by removing an area of the bottom-surface conductive film.

34. The multilayer ceramic substrate according to claim 20, further comprising an inductor conductive film disposed in the multilayer composite member such that the capacitor conductive film faces the capacitor conductive film via at least one ceramic layer.

35. The multilayer ceramic substrate according to claim 31, wherein at least one of the capacitor conductive film and the second capacitor conductive film is strip-line shaped.

36. The multilayer ceramic substrate according to claim 32, wherein at least one of the capacitor conductive film and the second capacitor conductive film is strip-line shaped.

37. The multilayer ceramic substrate according to claim 33, wherein the area of the bottom-surface conductive film is removed by one of trimming and cutting.

38. The multilayer ceramic substrate according to claim 34, wherein the inductor conductive film, the capacitor conductive film, and the bottom-surface conductive film define a series resonant circuit.

\* \* \* \* \*